United States Patent [19]

Greenstein

[11] Patent Number: 4,851,301

[45] Date of Patent: Jul. 25, 1989

[54] SOLDER BONDING WITH IMPROVED PEEL STRENGTH

[75] Inventor: Bernard Greenstein, Glenview, Ill.

[73] Assignee: Motorola, Inc., Schaumburg, Ill.

[21] Appl. No.: 155,466

[22] Filed: Feb. 12, 1988

[51] Int. Cl.[4] ............................................. B32B 15/04
[52] U.S. Cl. ............................. 428/632; 428/647/673
[58] Field of Search ............... 428/620, 621, 632, 646, 428/647, 673; 228/123, 124

[56] References Cited

U.S. PATENT DOCUMENTS

| | | | |
|---|---|---|---|
| 3,409,809 | 11/1968 | Diehl | 428/620 |
| 3,700,420 | 10/1972 | Bristow | 428/673 |
| 4,610,934 | 9/1986 | Boecker et al. | 228/124 |
| 4,746,583 | 5/1988 | Falanga | 428/673 |
| 4,793,543 | 12/1988 | Gainey et al. | 228/123 |

OTHER PUBLICATIONS

*Research Disclosure*, No. 270, Oct. 1986, "A Low Stressed Bonding Structure for Thin Film Adhesion." Highly Wire Bondable—Low Failure Exposure Top Surface Metallurgy, by Fraser, Jenkins and Lynch, IBM Technical Disclosure Bulletin, vol. 15, No. 10, Mar. 1973, p. 3020.

*Primary Examiner*—L. Dewayne Rutledge
*Assistant Examiner*—George Wyszomierski
*Attorney, Agent, or Firm*—John H. Moore

[57] ABSTRACT

A solder bonding technique for bonding discrete circuit elements to conductors on an alumina substrate. The conductors are composed of palladium and silver, and atop each conductor at a bonding site, a layer of silver is provided. A layer of solder is disposed over the layer of silver. The compliancy of the silver layer absorbs stresses created by thermal cycles and thereby improves the peel strength of the solder bond.

2 Claims, 1 Drawing Sheet

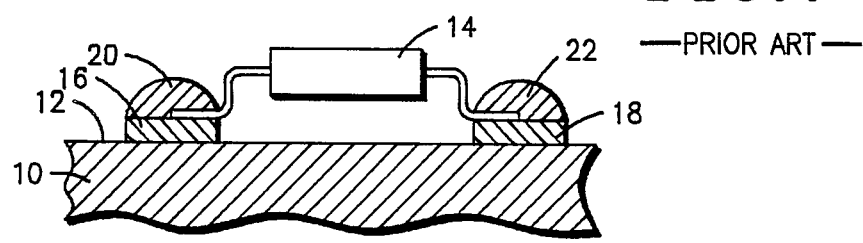
FIG. 1 —PRIOR ART—
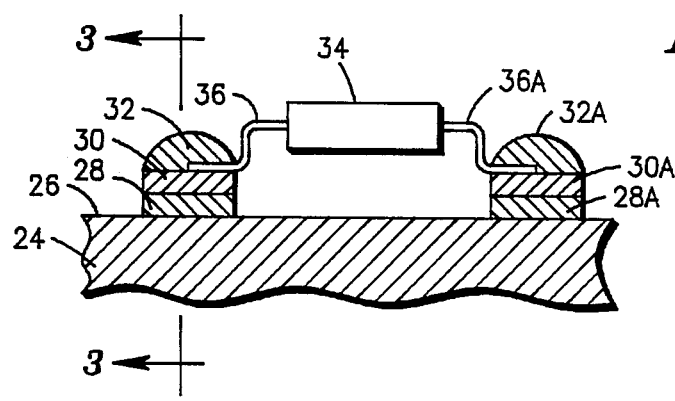
FIG. 2
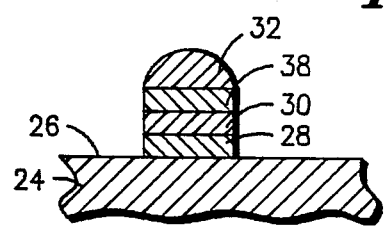
FIG. 4
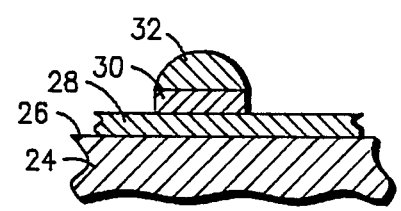
FIG. 3

SOLDER BONDING WITH IMPROVED PEEL STRENGTH

FIELD OF THE INVENTION

This invention is directed to the improvement of solder bonds for discrete circuit elements, and particularly to improved solder bonds for thick film circuit assemblies.

BACKGROUND OF THE INVENTION

Electronic circuit assemblies that are constructed using thick film techniques typically include solder bonds for electrically connecting discrete components to conductors on an alumina substrate. These conductors are usually made of a palladium-silver composition, or the equivalent, and are printed onto the alumina substrate. Solder is printed over the conductor where a lead of a circuit element is to be connected, and the solder is re-flowed to physically join the lead to the conductor.

Bonds formed by the foregoing technique have a drawback in that they tend to break down when the solder bond is thermally cycled many times. Specifically, solder bonds that start out with a peel strength of about 30 newtons can end up with a peel strength of zero after they have been subjected to more than 100 thermal cycles of temperature changes ranging from −50° C. to +150° C. Thus, solder bonds made as described above require substantial improvement before they are acceptable in applications where substantial thermal cycles occur.

OBJECTS OF THE INVENTION

It is a general object of the invention to provide an improved solder bond that has improved peel strength characteristics.

It is another object of the invention to provide a method of forming an improved solder bond using thick film techniques.

BRIEF DESCRIPTION OF THE FIGURES

FIG. 1 shows a component fixed to a conductor on an alumina substrate by means of a conventional solder bond;

FIG. 2 shows a component fixed to a conductor on a substrate in accordance with this invention;

FIG. 3 is a view taken along lines 3—3 of FIG. 2; and

FIG. 4 illustrates an alternate embodiment of a solder bond in accordance with this invention.

DESCRIPTION OF THE PREFERRED EMBODIMENT

Referring to FIG. 1, a substrate 10 made of alumina (AL$_2$O$_3$) has an upper surface 12 on which thick film resistors, conductors and other components may be printed using conventional thick film techniques. The substrate 10 may also support conventional discrete components, such as the component 14.

Printed onto the surface 12 are conductors 16 and 18, each composed of palladium and silver. As shown, the component 14 is bonded to these conductors 16, 18 by means of solder at 20 and 22.

As discussed previously, one of the problems with this type of bonding technique is that thermal cycling can destroy the bond. Specifically, the bond between the substrate's upper surface 12 and the conductors 16 or 18 can deteriorate to the point where the peel strength of the bond at that point can be reduced to zero. This undesirable result is due to the fact that the coefficient of expansion of the alumina substrate is much lower than the coefficients of expansion of the component 14, the conductors 16, 18 and the solder 20, 22. As the various components react to thermal cycling, the stress caused by the differences in coefficients of expansion deteriorates the bond between the conductors 16, 18 and the alumina surface 12.

A prior attempt to overcome the foregoing problem consisted of increasing the thickness of the solder at 20, 22 in an attempt to increase the compliancy of the solder joint and absorb stress. However, this approach has not resulted in a satisfactory increase in peel strength.

Referring now to FIGS. 2 and 3, a bonding structure is shown which provides improved peel strength between a conductor and the underlying substrate. In the illustrated embodiment, an alumina substrate 24 has an upper surface 26. This upper surface carries a pair of conductors 28 and 28a that are made of a composition that includes silver. Preferably, the conductors 28 and 28a are made of a palladium-silver composition having a binder (such as glass) to improve adhesion between the conductors and the surface 26. Alternately, the conductors 28 and 28a may be composed only of silver plus a binder.

At a location on the conductors 28, 28a where a bonding operation is to take place (i.e., at a bonding site), each conductor is covered with a layer 30, 30a of substantially pure silver. As used herein, the term substantially pure silver means silver with no more than 3% binder or other material added to the silver. Preferably, the layers 30 and 30a consist essentially of pure silver.

Disposed atop the silver layers 30 and 30a are solder layers 32 and 32a. These solder layers may be 62% tin, 36% lead and 2% silver. A discrete component 34 has wire leads 36 and 36a which are conventionally received by the solder at 32 and 32a to make electrical connection to the conductors 28 and 28a through the silver layers 30 and 30a.

In the event that the substrate 24 is a part of a thick film circuit, the conductors 28 and 28a and the layers 30 and 30a will be preferably formed using thick film techniques. More specifically, the conductors 28 and 28a may be printed onto the substrate 24 conventionally. Then the layers 30 and 30a are printed onto the conductors 28 and 28a at locations where bonding sites are to be established. For example, FIG. 3 shows a bonding site where the silver layer 30 and the solder layer 32 overlie the conductor 28.

The silver layers 30 and 30a preferably are about one-half mil thick. The solder layers 32 and 32a, in paste form, are printed over the silver layers to a depth of about 2–10 mils. All the other layers are fired in the conventional thick film manner.

The resultant bonding structure has a number of advantages. First, the silver layer 30, being substantially pure silver, is compliant and therefore is believed to absorb stresses which occur during thermal cycling, resulting in much less stress being imposed on the interface between the substrate surface 26 and the conductor 28. Consequently, the peel strength at that interface is not significantly degraded.

Another factor which is believed to provide improved peel strength is that the coefficient of expansion (about $19 \times 10^{-6}$ in./in. °C.) of the silver layers 30 and 30a is intermediate the coefficients of expansion of the palladium-silver conductors 28, 28a (typically about $12 \times 10^{-6}$ in./in. °C.) and the solder layers 32, 32a (typically $25 \times 10^{-6}$ in./in. °C.). With the alumina substrate having the lowest coefficient of expansion (about $6 \times 10^{-6}$ in./in. °C.) in the structure, the entire structure has incrementally increasing coefficients of expansion, much like a graded seal.

Another advantage is that the silver layers 30, 30a provide more solderable surfaces for the solder layers 32 and 32a to bond to.

In some applications, it may be desirable to increase the compliancy of the bonding structure over the compliancy provided by the structure of FIG. 2. In that case, a thicker silver layer may be formed, as depicted in FIG. 4. As shown, the bonding structure includes a conductor 28 on the surface 26 of the substrate 24. At the bonding site, a pair of relatively thin (one-half mil) layers 30 and 38 of substantially pure silver are printed over the conductor 28. A solder layer 32 is printed onto the top silver layer 38. The additional silver layer 38, the only difference from the structure shown in FIG. 2, provides a thicker and more compliant layer of silver. Thus, the intermediate silver layer between the solder and the conductor may be considered as a single layer 28 (as in FIG. 2) or as multiple layers (as in FIG. 4). In either case, a substantial improvement in peel strength is provided while also providing a highly solderable surface and minimizing silver leech from the underlying conductor.

Although the invention has been described in terms of a preferred embodiment, it will be obvious to those skilled in the art that various alterations and modifications can be made without departing from the invention. For example, the disclosed bonding structure is not limited to use with thick film circuit assemblies, and various impurities and/or other ingredients may be included in the compliant silver layer so long as they do not materially detract from the compliancy of that layer. Accordingly, it is intended that all such alterations and modifications be considered as within the spirit and scope of the invention as defined by the appended claims.

What is claimed is:

1. The combination, comprising:
an alumina substrate having an upper surface;
at least one conductor on the upper surface of the substrate, said conductor comprising palladium and silver and having a first coefficient of expansion;
a layer of substantially pure silver having a second coefficient of expansion that is greater than the first coefficient of expansion and being disposed at a bonding site on the conductor; and
a layer of solder disposed on the layer of silver and having a third coefficient of expansion that is greater than the second coefficient of expansion.

2. A structure for solder-bonding a circuit element at a bonding site on a substrate that includes alumina, the structure comprising:
at least one conductor disposed on the substrate, said conductor comprising palladium and silver, and having a first coefficient of expansion;
a layer of substantially pure silver disposed on the conductor at the bonding site and having a second coefficient of expansion that is greater than the first coefficient of expansion; and
a layer of solder disposed on the layer of silver to form a bond with the circuit element, the layer of solder having a third coefficient of expansion that is greater than the second coefficient of expansion.

* * * * *